United States Patent
Tashiro

(10) Patent No.: US 11,332,118 B2
(45) Date of Patent: May 17, 2022

(54) ELECTRIC MOTOR VEHICLE AND CONTROL METHOD FOR ELECTRIC MOTOR VEHICLE

(71) Applicant: TOYOTA JIDOSHA KABUSHIKI KAISHA, Toyota (JP)

(72) Inventor: Hiroki Tashiro, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 594 days.

(21) Appl. No.: 16/251,633

(22) Filed: Jan. 18, 2019

(65) Prior Publication Data
US 2019/0232947 A1 Aug. 1, 2019

(30) Foreign Application Priority Data
Jan. 29, 2018 (JP) .............................. JP2018-012401

(51) Int. Cl.
| | |
|---|---|
| *B60W 20/13* | (2016.01) |
| *B60L 7/16* | (2006.01) |
| *B60L 15/20* | (2006.01) |
| *G01R 31/36* | (2020.01) |
| *H01M 10/44* | (2006.01) |
| *H01M 10/48* | (2006.01) |

(Continued)

(52) U.S. Cl.
CPC .............. *B60W 20/13* (2016.01); *B60L 7/16* (2013.01); *B60L 15/2045* (2013.01); *G01R 31/36* (2013.01); *H01M 10/0525* (2013.01); *H01M 10/44* (2013.01); *H01M 10/48* (2013.01); *H02J 7/0047* (2013.01)

(58) Field of Classification Search
None
See application file for complete search history.

(56) References Cited

U.S. PATENT DOCUMENTS

| | | | |
|---|---|---|---|
| 2007/0145948 A1* | 6/2007 | Lim ...................... | B60W 10/26 320/132 |
| 2010/0156352 A1* | 6/2010 | Muta ..................... | B60W 20/13 320/134 |

(Continued)

FOREIGN PATENT DOCUMENTS

| | | |
|---|---|---|
| CN | 1988242 A | 6/2007 |
| CN | 101384461 A | 3/2009 |

(Continued)

*Primary Examiner* — Geepy Pe
*Assistant Examiner* — Bakari Underwood
(74) *Attorney, Agent, or Firm* — Sughrue Mion, PLLC

(57) ABSTRACT

Provided is an electric motor vehicle including a secondary battery, an electric motor, and a control device that controls an input to and an output from the secondary battery. Using an SOC of the secondary battery, the control device calculates a first OCV that is an OCV based on an assumption of absence of a change in voltage due to polarization. Using a voltage and a current of the secondary battery, the control device calculates a second OCV that is an OCV including a change in voltage due to polarization. When a voltage difference between the first OCV and the second OCV resulting from discharging of the secondary battery is large, the control device augments a limit value of electricity input into the secondary battery to be higher than a limit value when the voltage difference is small.

10 Claims, 7 Drawing Sheets

(51) Int. Cl.
*H02J 7/00* (2006.01)
*H01M 10/0525* (2010.01)

(56) References Cited

U.S. PATENT DOCUMENTS

| | | | |
|---|---|---|---|
| 2012/0123626 A1* | 5/2012 | Takahashil | ............ B60L 58/25 |
| | | | 701/22 |
| 2012/0232736 A1* | 9/2012 | Aoki | ............ B60K 6/445 |
| | | | 701/22 |
| 2016/0001766 A1 | 1/2016 | Mori | |
| 2018/0226824 A1 | 8/2018 | Sakabe et al. | |

FOREIGN PATENT DOCUMENTS

| | | | |
|---|---|---|---|
| CN | 102470772 A | 5/2012 | |
| JP | 2009-145065 A | 7/2009 | |
| JP | 2013-213684 A | 10/2013 | |
| JP | 2014-187853 A | 10/2014 | |
| JP | 2017-17907 A | 1/2017 | |
| WO | 2007/093882 A2 | 8/2007 | |
| WO | 2011/004247 A2 | 1/2011 | |

* cited by examiner

ELECTRIC MOTOR VEHICLE AND CONTROL METHOD FOR ELECTRIC MOTOR VEHICLE

INCORPORATION BY REFERENCE

The disclosure of Japanese Patent Application No. 2018-012401 filed on Jan. 29, 2018 including the specification, drawings and abstract is incorporated herein by reference in its entirety.

BACKGROUND

1. Technical Field

The present disclosure relates to an electric motor vehicle and a control method for an electric motor vehicle, and more particularly to a technique of controlling an input to and an output from a secondary battery installed in an electric motor vehicle.

2. Description of Related Art

Japanese Patent Application Publication No. 2013-213684 (JP 2013-213684 A) discloses a technique of calculating an open circuit voltage (OCV) for estimating a state of charge (SOC) of a secondary battery. In the electricity storage system disclosed in this literature, the OCV of the secondary battery is calculated based on a closed circuit voltage (CCV) detected by a voltage sensor, a first voltage variation attributable to internal resistance according to charging and discharging current values detected by a current sensor, and a second voltage variation attributable to polarization. Then, the SOC of the secondary battery is calculated based on OCV-SOC characteristics that predefine the correspondence relationship between the calculated OCV and the SOC (see JP 2013-213684 A).

SUMMARY

When discharging of a secondary battery is continued, unevenness in concentration of charge carriers increases in a surface of an electrode active material. Such unevenness in concentration of charge carriers in an electrode is also called polarization. When polarization occurs, the OCV decreases compared with that when no polarization is occurring. As a result, the voltage of the secondary battery decreases and is likely to reach a lower limit voltage. When the voltage has decreased to the lower limit voltage, the output (discharging) of the secondary battery is limited to protect the secondary battery. Thus, when polarization occurs due to continuous discharging, the chances that the output of the secondary battery will be limited may increase.

The present disclosure provides an electric motor vehicle and a control method for an electric motor vehicle that can make polarization of a secondary battery disappear quickly.

An electric motor vehicle according to a first aspect of the present disclosure includes a secondary battery that is rechargeable, an electric motor that exchanges electricity with the secondary battery, and a control device that controls an input to and an output from the secondary battery. By using an SOC of the secondary battery, the control device calculates a first OCV that is an OCV based on an assumption of absence of a change in voltage due to polarization. By using a voltage and a current of the secondary battery, the control device calculates a second OCV that is an OCV including a change in voltage due to polarization. When a voltage difference between the first OCV and the second OCV resulting from discharging of the secondary battery is large, the control device executes an augmentation process of augmenting a limit value of electricity input into the secondary battery to be higher than a limit value when the voltage difference is small.

A control method for an electric motor vehicle including a secondary battery that is rechargeable and an electric motor that exchanges electricity with the secondary battery according to a second aspect of the present disclosure includes: by using an SOC of the secondary battery, calculating a first OCV that is an OCV based on an assumption of absence of a change in voltage due to polarization; by using a voltage and a current of the secondary battery, calculating a second OCV that is an OCV including a change in voltage due to polarization; and when a voltage difference between the first OCV and the second OCV resulting from discharging of the secondary battery is large, augmenting a limit value of electricity input into the secondary battery to be higher than a limit value when the voltage difference is small.

In the above electric motor vehicle and control method, the first OCV based on an assumption of absence of a change in voltage due to polarization and the second OCV including a change in voltage due to polarization are calculated. The second OCV is calculated by using the voltage and the current of the secondary battery, and corresponds to the actual electromotive voltage. When the voltage difference between the first OCV and the second OCV resulting from discharging of the secondary battery is large, the augmentation process of augmenting the input electricity limit value (Win) to be higher than that when the voltage difference is small is executed. Since the second OCV (actual electromotive voltage) has decreased relative to the first OCV, the voltage of the secondary battery has a margin to an upper limit voltage accordingly. Therefore, the charging electricity or the chance of charging of the secondary battery can be increased by augmenting the input electricity limit value. Thus, unevenness in concentration of charge carriers (polarization) resulting from discharging can be made to disappear quickly. As a result, it is possible to reduce the chances that the voltage of the secondary battery will reach a lower limit voltage, and to thereby avoid limiting the output (discharging) of the secondary battery.

In the above aspect, the extent of augmentation of the limit value may be larger as the voltage difference is larger.

The larger the voltage difference, the larger the degree of decrease of the second OCV (actual electromotive voltage) relative to the first OCV and therefore the larger the margin to the upper limit voltage, which allows for a larger extent of augmentation of the input electricity limit value. Increasing the extent of augmentation of the input electricity limit value can make unevenness in concentration of charge carriers (polarization) resulting from discharging disappear more quickly.

In the above configuration, the control device may calculate the limit value by using an SOC of the secondary battery, and the augmentation process may include a process of augmenting the limit value by multiplying the limit value calculated by using the SOC by a ratio of a difference between an upper limit voltage of the secondary battery and the second OCV to a difference between the upper limit voltage and the first OCV.

Thus, the extent of augmentation of the input electricity limit value can be made larger as the voltage difference between the first OCV and the second OCV is larger. Increasing the extent of augmentation of the input electricity limit value can make unevenness in concentration of charge carriers (polarization) resulting from discharging disappear more quickly.

In the above aspect, the electric motor may be configured to generate a braking force for the electric motor vehicle by generating electricity, and the control device may not execute the augmentation process while the electric motor vehicle is braking.

When the augmentation process switches from execution to non-execution, the input electricity limit value returns from an augmented state. As electricity input into the electricity storage device is limited to the input electricity limit value having thus returned from the augmented state, electricity generation of the electric motor is limited, which may affect the behavior of the vehicle if the vehicle is braking at that time. It is possible to avoid such an influence on the behavior of the vehicle by not executing the augmentation process when the electric motor vehicle is braking.

In the above aspect, the electric motor may be configured to generate a braking force for the electric motor vehicle by generating electricity, and the control device may not execute the augmentation process when a predetermined condition is met under which it is expected that the vehicle may undergo a change in behavior upon a shift from execution to non-execution of the augmentation process.

When the augmentation process switches from execution to non-execution, the input electricity limit value returns from the augmented state. Then, electricity generation of the electric motor is limited and the braking force from the electric motor changes, which may cause a change in behavior of the vehicle. It is possible to avoid a change in behavior of the vehicle by not executing the augmentation process when the predetermined condition is met under which it is expected that the vehicle may undergo a change in behavior.

The predetermined condition may be met, for example, when both of an accelerator pedal and a brake pedal are not operated while the vehicle is running. If the augmentation process is executed under such a condition, electricity generated by the electric motor may change (be limited) as the input electricity limit value returns from the augmented state upon switching to non-execution. As a result, the braking force from the electric motor changes and it is expected that the vehicle may undergo a change in behavior as described above.

Alternatively, the predetermined condition may be met, for example, when the secondary battery is in a state of having a low temperature and/or a high SOC. When the secondary battery is in the state of having a low temperature and/or a high SOC, the input electricity limit value is low and therefore electricity input into the secondary battery is highly likely to be at the input electricity limit value. It is expected that the vehicle may undergo a change in behavior as described above when the augmentation process switches from execution to non-execution under such a condition.

In the above aspect, the electric motor vehicle may further include an engine. The electric motor may be configured to generate electricity by using an output of the engine, and the control device may not execute the augmentation process when a predetermined condition is met under which it is expected that noise and/or vibration change as a state of the engine changes upon a shift from execution to non-execution of the augmentation process.

When the augmentation process switches from execution to non-execution, the input electricity limit value returns from the augmented state. Then, electricity generation of the electric motor is limited and the state of the engine changes accordingly, which leads to expectations of changes in noise and/or vibration. It is possible to avoid changes in noise and/or vibration by not executing the augmentation process when the predetermined condition is met under which changes in noise and/or vibration are expected.

The predetermined condition may be met, for example, when the vehicle is stationary or running at low speed. Changes in noise and/or vibration as described above are expected when the vehicle is stationary or running at low speed, since a user can easily sense noise and/or vibration under such a condition.

The electric motor vehicle and the control method for an electric motor vehicle of the present disclosure can make polarization of a secondary battery disappear quickly.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
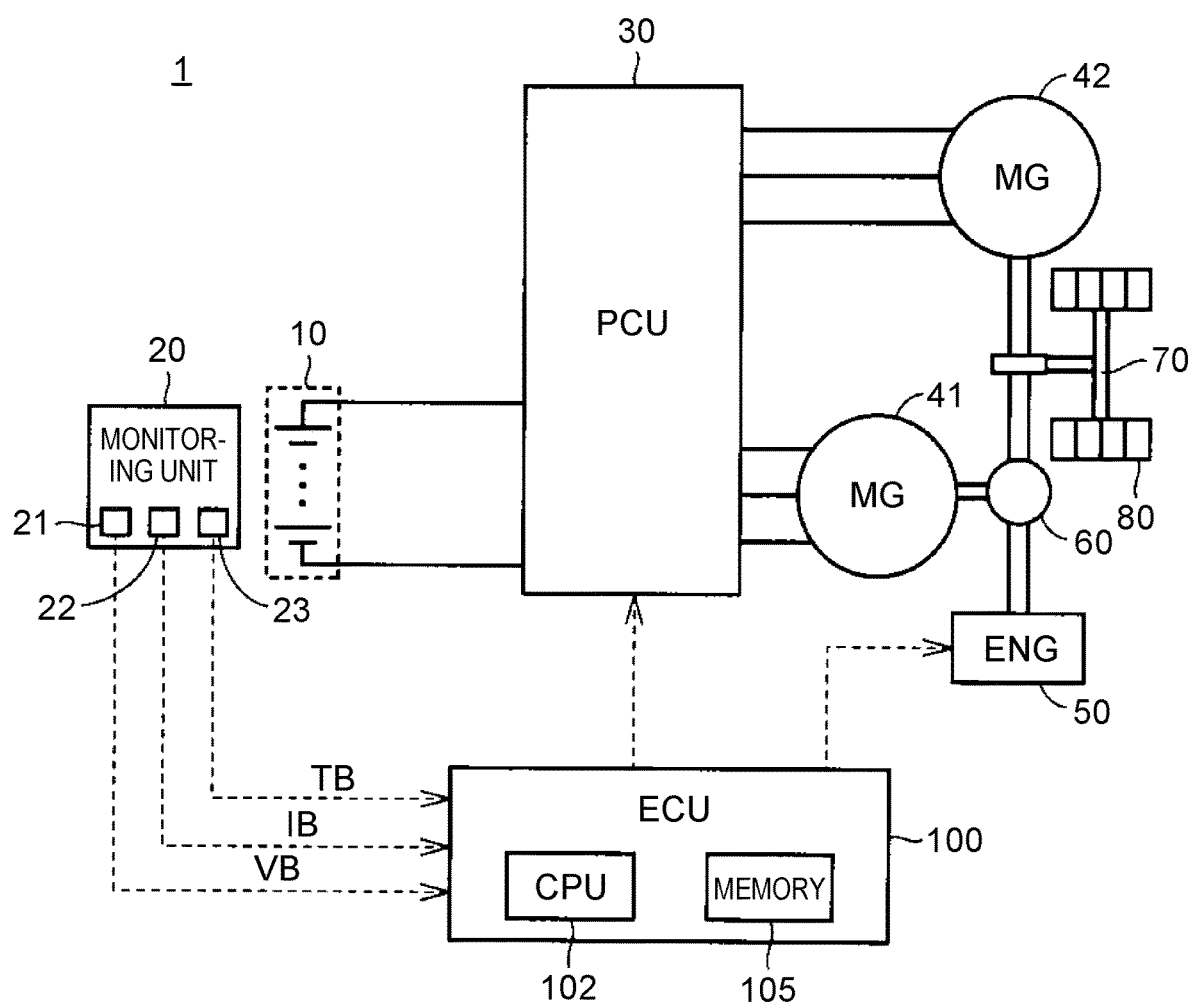
FIG. 1 is a diagram schematically showing the configuration of an electric motor vehicle according to Embodiment 1.

Embodiments of the present disclosure will be described below in detail with reference to the drawings. While a plurality of embodiments will be described below, appropriately combining configurations described in the respective embodiments is expected from the beginning of application. The same or corresponding parts in the drawings will be denoted by the same reference signs to avoid repeating the same description.

Embodiment 1

Overall Configuration of Electric Motor Vehicle

FIG. 1 is a diagram schematically showing the configuration of an electric motor vehicle according to Embodiment 1. In the following, a case where the electric motor vehicle is a hybrid electric vehicle equipped with an engine will be described. However, the electric motor vehicle according to Embodiment 1 is not limited to a hybrid electric vehicle and may instead be an electric vehicle that is not equipped with an engine.

Referring to FIG. 1, an electric motor vehicle 1 includes a battery pack 10, a monitoring unit 20, a power control unit (hereinafter referred to as a PCU) 30, motor generators (hereinafter referred to as MGs) 41, 42, an engine 50, a power split device 60, a drive shaft 70, drive wheels 80, and an electronic control unit (hereinafter referred to as an ECU) 100.

The battery pack 10 includes a plurality of secondary single cells (hereinafter also referred to simply as cells). These cells are assumed to be lithium-ion secondary cells in the following description, but may instead be other cells, such as nickel-metal hydride secondary cells. A plurality of cells is assembled to form a module, and a plurality of modules is further assembled to form the battery pack 10. However, thus assembling the cells into a module is not essential. The battery pack 10 stores electricity for driving the MGs 41, 42, and can supply electricity to the MGs 41, 42 through the PCU 30. When the MGs 41, 42 are generating electricity, the battery pack 10 is charged by receiving the generated electricity through the PCU 30.

The monitoring unit 20 includes a voltage sensor 21, a current sensor 22, and a temperature sensor 23. The voltage sensor 21 detects a voltage VB of the battery pack 10. The current sensor 22 detects charging and discharging currents IB of the battery pack 10. The temperature sensor 23 detects a temperature TB of the battery pack 10. The voltage sensor 21 may detect the voltage of each cell, or may detect the voltage of each assembly of cells that are connected in parallel to one another. The temperature sensor 23 may detect the temperature of each cell, or may detect the temperature of each set (e.g., each module) of cells. The current sensor 22 detects the discharging current as a positive value and detects the charging current as a negative value. Each sensor outputs a signal indicating a detection result to the ECU 100.

The PCU 30 bi-directionally converts electricity between the battery pack 10 and the MGs 41, 42 according to a control signal from the ECU 100. The PCU 30 is configured to be able to control the states of the MGs 41, 42 independently, and for example, can put the MG 42 into an electricity supplying state while putting the MG 41 into a regenerating (electricity generating) state. For example, the PCU 30 includes two inverters that are provided so as to correspond to the MGs 41, 42, and a converter that boosts a direct-current voltage supplied to each inverter to be equal to or higher than the voltage of the battery pack 10.

The MGs 41, 42 are alternating-current rotating electric machines, for example, three-phase alternating-current synchronous electric motors having permanent magnets embedded in a rotor. The MG 41 is used mainly as a power generator that is driven by the engine 50 via the power split device 60. Electricity generated by the MG 41 is supplied to the MG 42 or the battery pack 10 through the PCU 30.

The MG 42 operates mainly as an electric motor and drives the drive wheels 80. The MG 42 is driven by receiving at least one of electricity from the battery pack 10 and electricity generated by the MG 41, and a driving force from the MG 42 is transmitted to the drive shaft 70. On the other hand, when the vehicle is braking or reducing the degree of acceleration on a downward slope, the MG 42 performs regeneration by operating as a power generator. Electricity generated by the MG 42 is supplied to the battery pack 10 through the PCU 30.

The engine 50 is an internal combustion engine that outputs motive power by converting combustion energy produced from combustion of an air-fuel mixture into kinetic energy of moving parts such as a piston and a rotor. For example, the power split device 60 includes a planetary gear mechanism having three rotational axes of a sun gear, a carrier, and a ring gear. The power split device 60 splits the motive power output from the engine 50 into motive power for driving the MG 41 and motive power for driving the drive wheels 80.

The ECU 100 includes a central processing unit (CPU) 102, a memory (a read only memory (ROM) and a random access memory (RAM)) 105, and input and output ports (not shown) through which various signals are input and output. The ECU 100 executes various modes of control, including control over the running state of the vehicle and control over charging and discharging of the battery pack 10, by controlling the engine 50 and the PCU 30 based on signals received from sensors and a program and a map stored in the memory 105. The various modes of control are not limited to being executed by software processing, but may be executed by building dedicated hardware (electronic circuit).

Description of Polarization in Battery Pack 10

When discharging of the battery pack 10 continues for a long time, unevenness in concentration of lithium (Li) that is charge carriers (hereinafter also referred to as an Li concentration) increases in a surface of an electrode active material of the cell.

Figure 2:
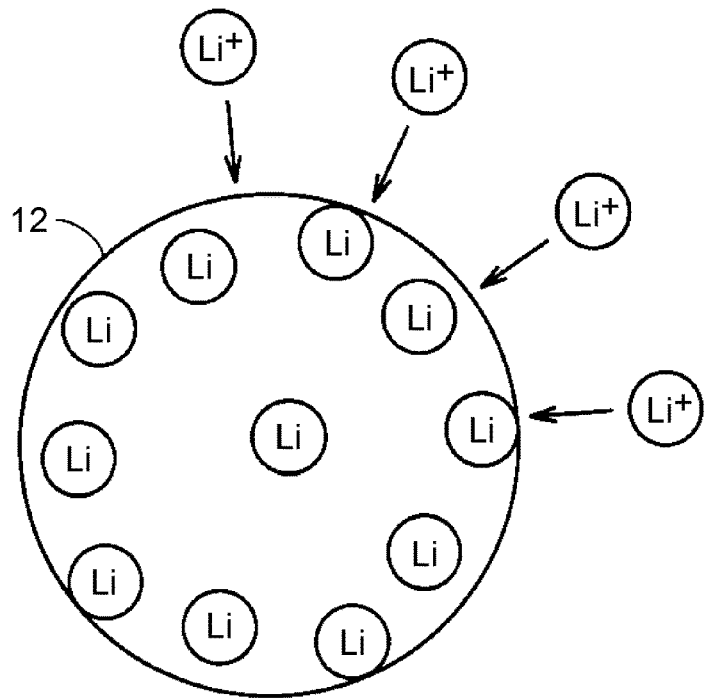
FIG. 2 is a diagram illustrating a mechanism of how unevenness in Li concentration occurs in a positive-electrode active material as discharging of a battery pack continues.
Figure 3:
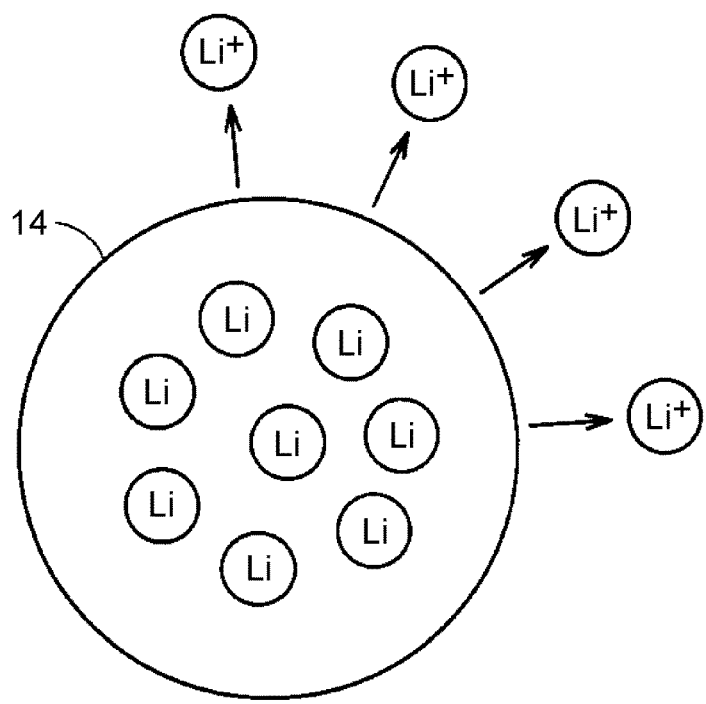
FIG. 3 is a diagram illustrating a mechanism of how unevenness in Li concentration occurs in a negative-electrode active material as discharging of the battery pack continues.

FIG. 2 is a diagram illustrating a mechanism of how unevenness in Li concentration occurs in a positive-electrode active material as discharging of the battery pack 10 continues. FIG. 3 is a diagram illustrating a mechanism of how unevenness in Li concentration occurs in a negative-electrode active material as discharging of the battery pack 10 continues.

Referring to FIG. 2, a positive-electrode active material 12 is composed, for example, of lithium metal oxide, such as lithium cobalt oxide. During discharging of the battery pack 10, electrons are emitted from a negative electrode to the outside and electrons are supplied from the outside to a positive electrode, so that lithium ions (Li+) move inside the cell from the negative electrode to the positive electrode (positive-electrode active material 12). Then, the lithium ions combine with the electrons supplied to the positive electrode to form lithium, which is accumulated in the positive-electrode active material 12.

When discharging continues, diffusion of lithium absorbed through a surface of the positive-electrode active material 12 to the inside of the positive-electrode active material 12 falls behind, resulting in unevenness in Li concentration between the surface and the inside of the positive-electrode active material 12. Specifically, a state arises in which the Li concentration in the surface of the positive-electrode active material 12 is higher than the Li concentration inside the positive-electrode active material 12.

Referring to FIG. 3, a negative-electrode active material 14 is composed, for example, of a carbon material, such as graphite. During discharging of the battery pack 10, electrons are emitted from the negative electrode to the outside, and lithium having been accumulated in the negative-electrode active material 14 turns into lithium ions (Li+) and is desorbed from the negative-electrode active material 14.

When discharging continues, diffusion of lithium from the inside to a surface of the negative-electrode active material 14 falls behind, resulting in unevenness in Li concentration between the surface and the inside of the negative-electrode active material 14. Specifically, a state arises in which the Li concentration in the surface of the negative-electrode active material 14 is lower than the Li concentration inside the negative-electrode active material 14.

Such unevenness in Li concentration (polarization) in the positive-electrode active material 12 and the negative-electrode active material 14 causes a decrease in OCV (a decrease in electromotive voltage) of the battery pack 10.

Figure 4:
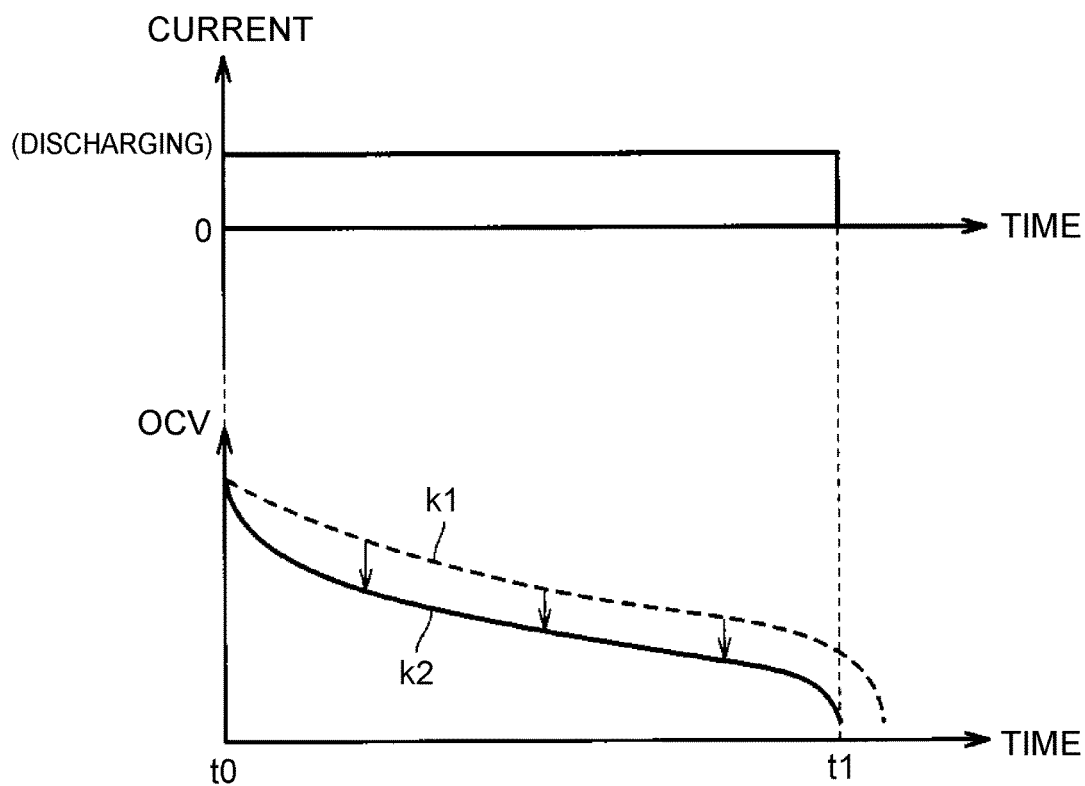
FIG. 4 is a graph showing a decrease in OCV due to continuous discharging of the battery pack.

FIG. 4 is a graph showing a decrease in OCV due to continuous discharging of the battery pack 10. Referring to FIG. 4, the dashed line k1 represents an OCV in the case where no unevenness in Li concentration (polarization) is occurring in a surface of an active material (hereinafter also referred to as an "OCV in the absence of polarization"), and the line k2 represents an OCV in the case where unevenness in Li concentration (polarization) is occurring in the surface of the active material due to continuous discharging (hereinafter also referred to as an "OCV in the presence of polarization").

The dashed line k1 (OCV in the absence of polarization) represents a theoretical OCV based on an assumption of absence of unevenness in Li concentration (polarization) in the surface of the active material despite continuous discharging, and for example, represents an OCV that is calculated from an SOC by using an SOC-OCV curve showing a correspondence relationship between the SOC and the OCV in the absence of polarization. In other words, the OCV in the absence of polarization is an OCV based on an assumption of absence of a change in voltage due to polarization.

On the other hand, the line k2 (OCV in the presence of polarization) represents an actual OCV (electromotive voltage), for example, an OCV that is calculated by using the voltage VB, the current IB, etc. of the battery pack 10. In other words, the OCV in the presence of polarization is an OCV including a change in voltage due to polarization.

As shown in FIG. 4, when unevenness in Li concentration (polarization) occurs in the surface of the active material due to continuous discharging, the OCV decreases compared with that when unevenness in Li concentration (polarization) is not occurring. As a result, the voltage VB of the battery pack 10 decreases and is likely to reach a lower limit voltage. When the voltage VB has decreased to the lower limit voltage, the output (discharging) of the battery pack 10 is limited to protect the battery pack 10. Thus, when unevenness in Li concentration (polarization) occurs in the surface of the active material due to continuous discharging, the chances that the output of the battery pack 10 will be limited may increase.

In the electric motor vehicle 1 according to Embodiment 1, therefore, when a voltage difference between the OCV in the absence of polarization and the OCV in the presence of polarization resulting from discharging of the battery pack 10 exceeds a threshold value, an input electricity limit value Win indicating an upper limit of electricity input (charged) into the battery pack 10 is augmented. The OCV decreases as discharging continues as described above, so that the margin of the voltage of the battery pack 10 to the upper limit voltage increases accordingly. Therefore, the charging electricity or the chance of charging of the battery pack 10 can be increased by augmenting the input electricity limit value Win. Thus, unevenness in Li concentration (polarization) in the surface of the active material resulting from discharging can be made to disappear quickly. As a result, it is possible to reduce the chances that the voltage VB of the battery pack 10 will reach the lower limit voltage, and to thereby avoid limiting the output (discharging) of the battery pack 10.

Figure 5:
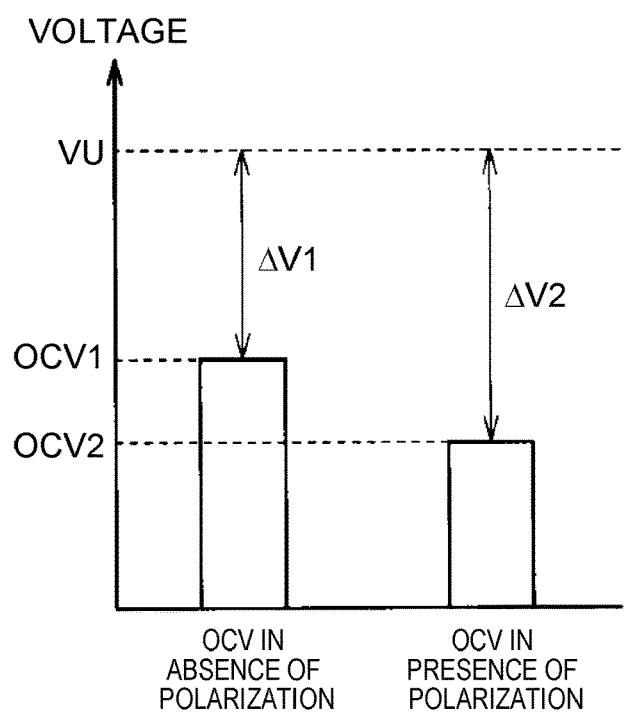
FIG. 5 is a graph showing a relationship between the OCV and an upper limit voltage.

FIG. 5 is a graph showing a relationship between the OCV and the upper limit voltage. Referring to FIG. 5, reference signs OCV1 and OCV2 represent respectively the OCV in the absence of polarization and the OCV in the presence of polarization at a certain timing. Reference sign VU represents the upper limit voltage of the battery pack 10. As shown, OCV2 that is the OCV in the presence of polarization is lower than OCV1 that is the OCV in the absence of polarization, and a voltage difference $\Delta V2$ between the upper limit voltage VU and OCV2 is accordingly larger than a voltage difference $\Delta V1$ between the upper limit voltage VU and OCV1.

Specifically, when unevenness in Li concentration (polarization) is occurring in the surface of the active material due to continuous discharging, the voltage of the battery pack 10 has a larger margin to the upper limit voltage than when unevenness in Li concentration (polarization) is not occurring ($\Delta V2 > \Delta V1$). In Embodiment 1, therefore, the charging electricity or the chance of charging of the battery pack 10 can be increased by augmenting the input electricity limit value Win when the voltage difference between the OCV in the absence of polarization and the OCV in the presence of polarization exceeds the threshold value.

When unevenness in Li concentration (polarization) has occurred in the surface of the active material due to continuous discharging, charging the battery pack 10 leads to disappearance of the unevenness in Li concentration (polarization) resulting from continuous discharging.

Figure 6:
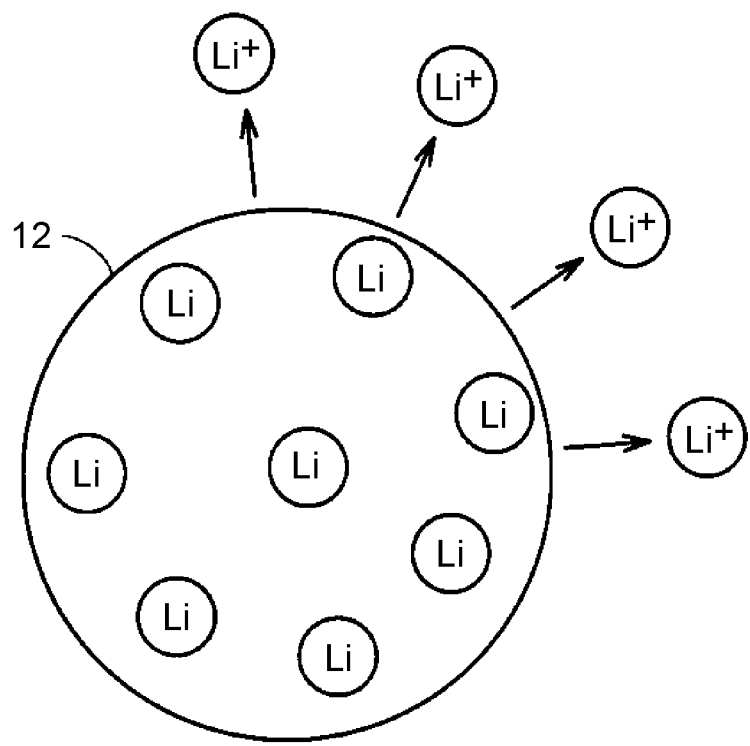
FIG. 6 is a diagram illustrating a mechanism of how charging leads to disappearance of unevenness in Li concentration in the positive-electrode active material resulting from continuous discharging.

FIG. 6 is a diagram illustrating a mechanism of how charging leads to disappearance of unevenness in Li concentration (polarization) in the positive-electrode active material 12 resulting from continuous discharging. Referring to FIG. 2 along with FIG. 6, when charging in the opposite direction is performed in a state where the Li concentration in the surface of the positive-electrode active material 12 has become higher than the Li concentration inside the positive-electrode active material 12 due to continuous discharging (FIG. 2), lithium turns into lithium ions (Li+) and is desorbed from the surface of the positive-electrode active material 12. As a result, the Li concentration in the surface of the positive-electrode active material 12 decreases, leading to disappearance of the unevenness in Li concentration (polarization) in the positive-electrode active material 12 resulting from continuous discharging.

In Embodiment 1, the input electricity limit value Win is augmented when the voltage difference between the OCV in the absence of polarization and the OCV in the presence of polarization exceeds the threshold value as described above. Thus, the charging electricity of the battery pack 10 is increased and disappearance of the unevenness in Li concentration (polarization) resulting from discharging can be promoted. As a result, it is possible to reduce the chances that the voltage VB will reach the lower limit voltage during discharging of the battery pack 10, and to thereby avoid limiting the output (discharging) of the battery pack 10.

The amount of augmentation of the input electricity limit value Win may be such that the extent of augmentation of the input electricity limit value Win is made larger as the voltage difference between the OCV in the absence of polarization and the OCV in the presence of polarization is larger. Referring back to FIG. 5, the larger the decrease in OCV due to polarization (the lower the OCV in the presence of polarization is relative to the OCV in the absence of polarization), the larger the margin of the voltage to the upper limit voltage VU, which allows for a larger extent of augmentation of the input electricity limit value Win. In Embodiment 1, the augmented input electricity limit value Win is calculated by the following Formula (1) by using the voltage difference $\Delta V1$ between the upper limit voltage VU and the OCV in the absence of polarization (OCV1) and the voltage difference $\Delta V2$ between the upper limit voltage VU and the OCV in the presence of polarization (OCV2).

Augmented Win=$(\Delta V2/\Delta V1)\times$WinB . . . (1) Here, reference sign WinB denotes the input electricity limit value Win in an unaugmented state (hereinafter referred to as a base Win). For the base Win (WinB), for example, a map showing a correspondence relationship between the SOC and the base Win (WinB) is prepared in advance with respect to each temperature TB, and the base Win (WinB) is calculated from the SOC and the temperature TB. Such a map is prepared in advance and stored in the memory etc. of the ECU 100.

Making the extent of augmentation of the input electricity limit value Win larger as the voltage difference between the OCV in the absence of polarization and the OCV in the presence of polarization is larger, can make unevenness in Li concentration (polarization) resulting from discharging disappear more quickly when the voltage difference is large.

The input electricity limit value Win may not be augmented when the vehicle is braking. In the electric motor vehicle 1, the MG 42 that drives the drive wheels 80 generates a braking force for the vehicle by performing regeneration while the vehicle is braking. If the input electricity limit value Win returns from an augmented state to the base Win while the vehicle is braking, the braking force from the MG 42 may decrease as the input into the battery pack 10 is limited and electricity generation of the MG 42 is limited. When the braking force from the MG 42 has decreased, a braking force of a mechanical brake is enhanced to secure a total braking force for the vehicle, but a user may feel an uncomfortable sensation when the decrease in braking force from the MG 42 is replaced by the braking force from the mechanical brake. In the electric motor vehicle 1 according to Embodiment 1, therefore, the input electricity limit value Win is not augmented when the vehicle is braking.

Figure 7:
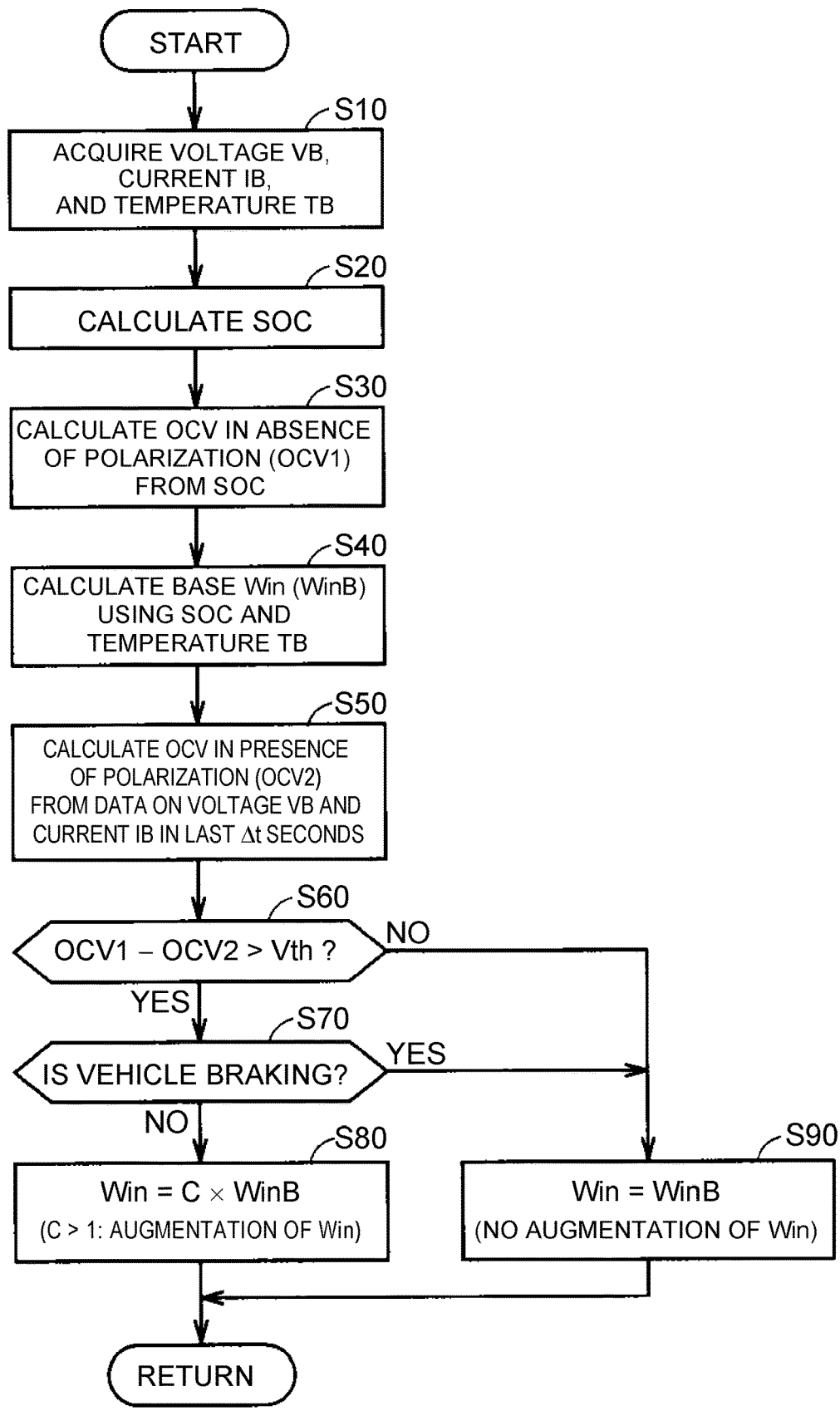
FIG. 7 is a flowchart showing an example of the procedure of an input electricity limit value augmentation process executed by an ECU.

FIG. 7 is a flowchart showing an example of the procedure of the process of augmenting the input electricity limit value Win executed by the ECU 100. The series of processes shown in this flowchart are called from a main routine and repeatedly executed once every predetermined time or upon meeting a predetermined condition.

Referring to FIG. 7, the ECU 100 acquires detection values of the voltage VB, the current IB, and the temperature TB from the voltage sensor 21, the current sensor 22, and the temperature sensor 23, respectively (step S10). Then, the ECU 100 calculates the SOC of the battery pack 10 (step S20). Commonly known various methods using the voltage VB, the current IB, etc. can be used as the method of calculating the SOC.

Figure 8:
FIG. 8 is a graph showing a correspondence relationship between an SOC and the OCV.

Next, the ECU 100 calculates the OCV in the absence of polarization (OCV1) from the SOC calculated in step S20 (step S30). For example, the ECU 100 uses an SOC-OCV map that shows a correspondence relationship between the SOC and the OCV based on an assumption of absence of a change in voltage due to polarization (OCV in the absence of polarization) as shown in FIG. 8, to calculate the OCV in the absence of polarization (OCV1) based on the SOC calculated in step S20. Such an SOC-OCV map is prepared in advance and stored in the memory etc.

The ECU 100 calculates the base Win (WinB) that is the input electricity limit value Win in the unaugmented state by using the SOC calculated in step S20 and the temperature TB acquired in step S10 (step S40). For example, a map showing a correspondence relationship between the SOC and the base Win (WinB) is prepared in advance with respect to each temperature TB, and the base Win (WinB) is calculated from the SOC and the temperature TB. Such a map is also prepared in advance and stored in the memory etc.

Next, the ECU 100 calculates the OCV in the presence of polarization (OCV2) that is the OCV including a change in voltage due to polarization, from data on the voltage VB and the current IB that have been successively detected in the last $\Delta t$ seconds (e.g., 30 seconds) up to the time of calculation (step S50).

Figure 9:
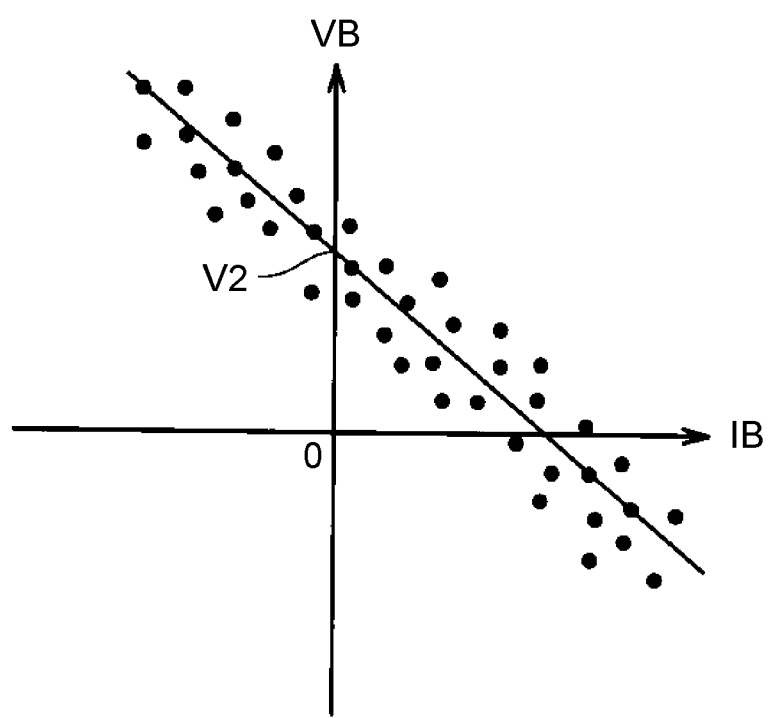
FIG. 9 is a graph illustrating an example of a method of calculating an OCV in the presence of polarization.

FIG. 9 is a graph illustrating an example of a method of calculating the OCV in the presence of polarization (OCV2). In FIG. 9, the horizontal axis shows the current IB of the battery pack 10 and the vertical axis shows the voltage VB of the battery pack 10. Referring to FIG. 9, the ECU 100 obtains a correlation between the voltage VB and the current IB in the last $\Delta t$ seconds. For example, a regression line of the voltage VB and the current IB is calculated from the data on the voltage VB and the current IB (black circles) in the last $\Delta t$ seconds. Then, the ECU 100 calculates a voltage value V2 on the calculated regression line at the intercept with the axis of the voltage VB (i.e., the value of the voltage VB when the current IB is zero on the calculated regression line) as the OCV in the presence of polarization (OCV2).

Referring back to FIG. 7, the ECU 100 determines by calculation whether the voltage difference between the OCV in the absence of polarization (OCV1) calculated in step S30 and the OCV in the presence of polarization (OCV2) calculated in step S50 is larger than a threshold value Vth (step S60).

When it is determined that the voltage difference between the OCV in the absence of polarization (OCV1) and the OCV in the presence of polarization (OCV2) is larger than the threshold value Vth (YES in step S60), the ECU 100 determines whether the electric motor vehicle 1 is braking (step S70). When it is determined that the electric motor vehicle 1 is not braking (NO in step S70), the ECU 100 augments the input electricity limit value Win (step S80). Specifically, the ECU 100 sets a value obtained by multiplying the base Win (WinB) calculated in step S40 by $C=\Delta V2/\Delta V1$ (C>1; see Formula (1)) as the input electricity limit value Win.

On the other hand, when it is determined in step S70 that the electric motor vehicle 1 is braking (YES in step S70), the ECU 100 sets the base Win (WinB) calculated in step S40 as the input electricity limit value Win (step S90). Thus, the ECU 100 does not augment the input electricity limit value Win in this case. This is because, as described above, if the input electricity limit value Win is augmented while the electric motor vehicle 1 is braking, a user may feel an uncomfortable sensation when augmentation of the input electricity limit value Win ends during regenerative braking.

Also when it is determined in step S60 that the voltage difference between the OCV in the absence of polarization (OCV1) and the OCV in the presence of polarization (OCV2) is equal to or smaller than the threshold value Vth (NO in step S60), the ECU 100 moves to the process in step S90. Thus, the ECU 100 does not augment the input electricity limit value Win.

Although this is not shown, a different threshold value Vth may be used in step S60 according to whether or not the input electricity limit value Win is augmented. Specifically, the threshold value Vth applied when the input electricity limit value Win is augmented may be set to be lower than the threshold value Vth applied when the input electricity limit value Win is not augmented. Thus, it is possible to allow for a hysteresis between execution and non-execution of augmentation of the input electricity limit value Win, and to thereby avoid frequently augmenting and returning the input electricity limit value Win.

As has been described above, in Embodiment 1, the input electricity limit value Win is augmented from the base Win when the voltage difference between the OCV in the absence of polarization and the OCV in the presence of polarization resulting from discharging of the battery pack 10 exceeds the threshold value Vth. Thus, the charging electricity or the chance of charging of the battery pack 10 can be increased, and unevenness in Li concentration (polarization) resulting from discharging can be made to disappear quickly. As a result, it is possible to reduce the chances that the voltage of the battery pack 10 will reach the lower limit voltage, and to thereby avoid limiting the output (discharging) of the battery pack 10.

In Embodiment 1, the extent of augmentation of the input electricity limit value Win is made larger as the voltage difference between the OCV in the absence of polarization and the OCV in the presence of polarization resulting from discharging of the battery pack 10 is larger. Specifically, the extent of augmentation of the input electricity limit value Win is calculated by multiplying the base Win (WinB) by the ratio C of the difference ΔV2 between the upper limit voltage VU and the OCV in the presence of polarization (OCV2) to the difference ΔV1 between the upper limit voltage VU and the OCV in the absence of polarization (OCV1). Thus, unevenness in Li concentration (polarization) resulting from discharging can be made to disappear more quickly.

In Embodiment 1, the input electricity limit value Win is not augmented when the vehicle is braking. Thus, the influence of the process of augmenting the input electricity limit value Win on the behavior of the vehicle can be avoided.

Embodiment 2

In Embodiment 1, the input electricity limit value Win is not augmented when it is determined that the electric motor vehicle 1 is braking. In Embodiment 2, the input electricity limit value Win is not augmented when it is expected that augmenting the input electricity limit value Win may cause noise and/or vibration or a change in behavior of the vehicle.

Examples of the case where a change in behavior of the vehicle is expected include a case where both of an accelerator pedal and a brake pedal are not operated (in other words, both of an accelerator pedal and a brake pedal are not pressed down) while the vehicle is running on a downhill etc. In this case, a braking force corresponding to engine braking of an engine-driven vehicle is generated by the MG 42. However, if the input electricity limit value Win is augmented in this situation, the braking force from the MG 42 may decrease as augmentation of the input electricity limit value Win ends. When augmentation of the input electricity limit value Win ends, electricity generation of the MG 42 may be limited as the input into the battery pack 10 is limited. As a result of such a decrease in braking force, the vehicle may undergo a change in behavior and give a user an uncomfortable sensation. If the amount of electricity generated by the MG 42 is smaller than the input electricity limit value Win, the above-described decrease in braking force that occurs as augmentation of the input electricity limit value Win ends does not occur even when augmentation of the input electricity limit value Win ends.

Another example of the case where a change in behavior of the vehicle is expected may be a case where the battery pack 10 is in a state of having a low temperature and/or a high SOC. When the battery pack 10 is in the state of having a low temperature and/or a high SOC, the input electricity limit value Win (base Win) is low, and therefore it is considered highly likely that the amount of electricity generated by the MG 42 has already reached the input electricity limit value Win. In this case, when augmentation of the input electricity limit value Win ends, electricity generation of the MG 42 is limited as the input into the battery pack 10 is limited. As a result of the decrease in the braking force from the MG 42, the vehicle may undergo a change in behavior and give a user an uncomfortable sensation.

Examples of the case where noise and/or vibration are expected include a case where the engine 50 is operating while the vehicle is stationary or running at low speed. When the vehicle is stationary or running at low speed, changes in noise and/or vibration can be easily sensed by a user. If the input electricity limit value Win is augmented while the engine 50 is operating and the MG 41 is generating electricity, the speed of the engine 50 may change as augmentation of the input electricity limit value Win ends. When augmentation of the input electricity limit value Win ends, electricity generation of the MG 41 is limited as the input into the battery pack 10 is limited, which may cause a change in output and speed of the engine 50. When the vehicle is stationary or running at low speed, a user may sense such a change in speed of the engine 50 and feel an uncomfortable sensation. If the amount of electricity generated by the MG 41 is smaller than the input electricity limit value Win, the change in output and speed of the engine 50 that occurs as augmentation of the input electricity limit value Win ends does not occur even when augmentation of the input electricity limit value Win ends.

Figure 10:
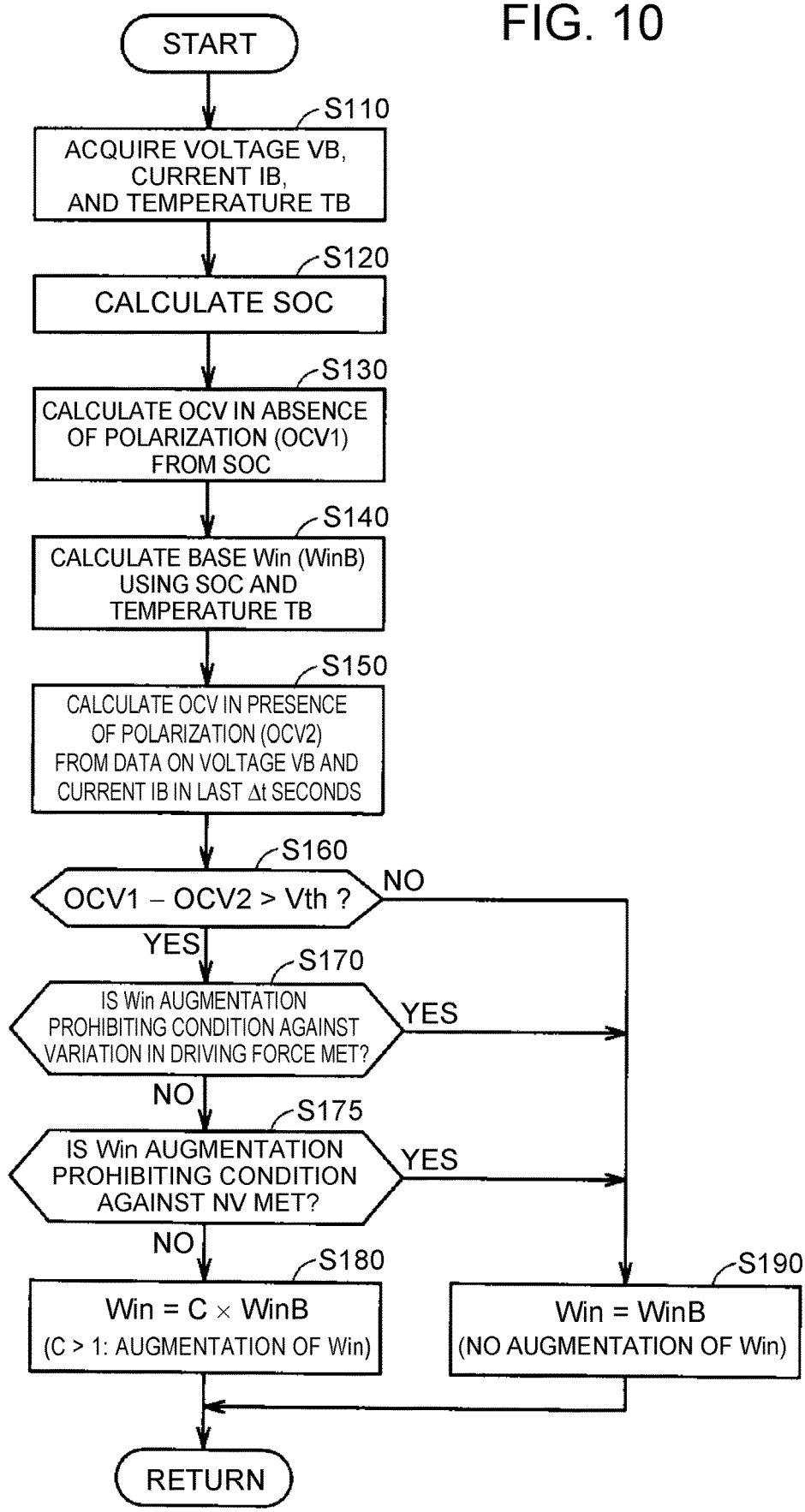
FIG. 10 is a flowchart showing an example of the procedure of an input electricity limit value augmentation process executed by the ECU in Embodiment 2.

FIG. 10 is a flowchart showing an example of the procedure of the process of augmenting the input electricity limit value Win executed by the ECU 100 in Embodiment 2. The series of processes shown in this flowchart are also called from a main routine and repeatedly executed once every predetermined time or upon meeting a predetermined condition.

Referring to FIG. 10, the processes in steps S110 to S160 are respectively the same as the processes in steps S10 to S60 shown in FIG. 8. When it is determined in step S160 that the voltage difference between the OCV in the absence of polarization (OCV1) and the OCV in the presence of polarization (OCV2) is larger than the threshold value Vth (YES in step S160), the ECU 100 determines whether a Win augmentation prohibiting condition against variation in driving force is met (step S170). The Win augmentation prohibiting condition against variation in driving force is a condition under which augmentation of the input electricity limit value Win is prohibited since variation in driving force of the vehicle resulting from augmentation of the input electricity limit value Win is expected. This condition is met, for example, when both of the accelerator pedal and the brake pedal are not operated (in other words, both of an accelerator pedal and a brake pedal are not pressed down) while the vehicle is running, or when the battery pack 10 is in the state of having a low temperature and/or a high SOC, as described above.

When it is determined in step S170 that the Win augmentation prohibiting condition against variation in driving force is met (YES in step S170), the ECU 100 moves to the process in step S190. The process in step S190 is the same as the process in step S90 shown in FIG. 8. Thus, the ECU 100 does not augment the input electricity limit value Win in this case.

When it is determined in step S170 that the Win augmentation prohibiting condition against variation in driving force is not met (NO in step S170), the ECU 100 determines whether a Win augmentation prohibiting condition against NV is met (step S175). The Win augmentation prohibiting condition against NV is a condition under which augmentation of the input electricity limit value Win is prohibited because augmenting the input electricity limit value Win would cause noise and/or vibration problems. This condition is met, for example, when the engine 50 is operating while the vehicle is stationary or running at low speed as described above.

When it is determined in step S175 that the Win augmentation prohibiting condition against NV is met (YES in step S175), the ECU 100 moves to the process in step S190. Thus, the ECU 100 does not augment the input electricity limit value Win in this case either.

On the other hand, when it is determined in step S175 that the Win augmentation prohibiting condition against NV is not met (NO in step S175), the ECU 100 moves to the process in step S180. The process in step S180 is the same as the process in step S80 shown in FIG. 8. Thus, the ECU 100 augments the input electricity limit value Win in this case.

Also when it is determined in step S160 that the voltage difference between the OCV in the absence of polarization (OCV1) and the OCV in the presence of polarization (OCV2) is equal to or smaller than the threshold value Vth (NO in step S160), the ECU 100 moves to the process in step S190. Thus, the ECU 100 does not augment the input electricity limit value Win.

While the above-described process includes both the Win augmentation prohibiting condition against variation in driving force (step S170) and the Win augmentation prohibiting condition against NV (step S175), the process may instead include only either the Win augmentation prohibiting condition against variation in driving force or the Win augmentation prohibiting condition against NV.

In Embodiment 2, as has been described above, the input electricity limit value Win is not augmented when it is expected that augmenting the input electricity limit value Win may cause a change in behavior of the vehicle. The input electricity limit value Win is not augmented also when it is expected that augmenting the input electricity limit value Win may cause a change in noise and/or vibration. Thus, the influence of augmentation of the input electricity limit value Win on the behavior of the vehicle or on noise and/or vibration can be avoided.

The embodiments disclosed this time are expected to be implemented also in appropriate combination as far as no technical inconsistency arises. The embodiments disclosed this time should be regarded as being in every respect merely illustrative and not restrictive. The scope of the present invention is defined not by the above description of the embodiments but by the claims, and is intended to include all possible modifications within a scope equivalent in meaning and scope to the claims.

What is claimed is:

1. An electric motor vehicle comprising:
    a secondary battery that is rechargeable;
    an electric motor that exchanges electricity with the secondary battery; and
    a control device that controls an input to and an output from the secondary battery, wherein:
    the control device is configured to calculate, by using a state of charge of the secondary battery, a first open circuit voltage that is based on an assumption of absence of a change in voltage due to polarization;
    the control device is configured to calculate, by using changes in a voltage and a current of the secondary battery in a predetermined period, a second open circuit voltage including a change in voltage due to polarization; and
    the control device is configured to, when a voltage difference between the first open circuit voltage and the second open circuit voltage resulting from discharging of the secondary battery exceeds a threshold, execute an augmentation process of augmenting a limit value indicating an upper limit of electricity input into the secondary battery to be higher than the limit value when the voltage difference is equal to or smaller than the threshold.

2. The electric motor vehicle according to claim 1, wherein a first extent of augmentation of the limit value when the voltage difference is a first voltage difference is larger than a second extent of augmentation of the limit value when the voltage difference is a second voltage difference, the first voltage difference being larger than the second voltage difference.

3. The electric motor vehicle according to claim 2, wherein:
    the control device is configured to calculate the limit value by using the state of charge of the secondary battery; and
    the augmentation process includes a process of augmenting the limit value by multiplying the limit value by a ratio of a difference between an upper limit voltage of the secondary battery and the second open circuit voltage to a difference between the upper limit voltage and the first open circuit voltage.

4. The electric motor vehicle according to claim 1, wherein:
    the electric motor is configured to generate a braking force for the electric motor vehicle by generating electricity; and
    the control device is configured not to execute the augmentation process while the electric motor vehicle is braking.

5. The electric motor vehicle according to claim 1, wherein:
    the electric motor is configured to generate a braking force for the electric motor vehicle by generating electricity; and
    the control device is configured not to execute the augmentation process when a predetermined condition is met under which it is expected that the vehicle undergoes a change in behavior upon a shift from execution to non-execution of the augmentation process.

6. The electric motor vehicle according to claim 5, wherein the predetermined condition is met when both of an accelerator pedal and a brake pedal are not operated while the vehicle is running.

7. The electric motor vehicle according to claim 5, wherein the predetermined condition is met when the secondary battery is in a state of having a low temperature and/or a high state of charge.

8. The electric motor vehicle according to claim 1, further comprising an engine, wherein:
- the electric motor is configured to generate electricity by using an output of the engine; and
- the control device is configured not to execute the augmentation process when a predetermined condition is met under which it is expected that noise and/or vibration change as a state of the engine changes upon a shift from execution to non-execution of the augmentation process.

9. The electric motor vehicle according to claim 8, wherein the predetermined condition is met when the vehicle is stationary or running at low speed.

10. A control method for an electric motor vehicle including a secondary battery that is rechargeable and an electric motor that exchanges electricity with the secondary battery, the control method comprising:
- by using a state of charge of the secondary battery, calculating a first open circuit voltage that is based on an assumption of absence of a change in voltage due to polarization;
- by using changes in a voltage and a current of the secondary battery in a predetermined period, calculating a second open circuit voltage including a change in voltage due to polarization; and
- when a voltage difference between the first open circuit voltage and the second open circuit voltage resulting from discharging of the secondary battery exceeds a threshold, augmenting a limit value indicating an upper limit of electricity input into the secondary battery to be higher than the limit value when the voltage difference is equal to or smaller than the threshold.

* * * * *